(12) United States Patent
Hayashi

(10) Patent No.: US 10,415,801 B2
(45) Date of Patent: Sep. 17, 2019

(54) METHOD FOR MANUFACTURING LINEAR LIGHT EMITTING DEVICE AND LINEAR LIGHT EMITTING DEVICE

(71) Applicant: NICHIA CORPORATION, Anan-shi, Tokushima (JP)

(72) Inventor: Tadao Hayashi, Tokushima (JP)

(73) Assignee: NICHIA CORPORATION, Anan-Shi (JP)

(*) Notice: Subject to any disclaimer, the term of this patent is extended or adjusted under 35 U.S.C. 154(b) by 0 days.

(21) Appl. No.: 15/721,381

(22) Filed: Sep. 29, 2017

(65) Prior Publication Data

US 2018/0094796 A1 Apr. 5, 2018

(30) Foreign Application Priority Data

Sep. 30, 2016 (JP) .................................. 2016-194501

(51) Int. Cl.
| | |
|---|---|
| *F21S 4/00* | (2016.01) |
| *F21V 17/10* | (2006.01) |
| *F21V 9/30* | (2018.01) |
| *F21V 3/02* | (2006.01) |
| *F21V 7/04* | (2006.01) |

(Continued)

(52) U.S. Cl.
CPC .............. *F21V 17/101* (2013.01); *F21V 3/02* (2013.01); *F21V 7/04* (2013.01); *F21V 9/30* (2018.02); *H01L 25/0753* (2013.01); *G02B 6/0011* (2013.01); *H01L 33/56* (2013.01); *H01L 2933/005* (2013.01)

(58) Field of Classification Search
USPC ......................................................... 362/223
See application file for complete search history.

(56) References Cited

U.S. PATENT DOCUMENTS

2007/0109792 A1  5/2007  Chosa et al.
2007/0223245 A1* 9/2007  Lee ...................... G02B 6/0038
                                                 362/600

(Continued)

FOREIGN PATENT DOCUMENTS

CN           101552311 A    10/2009
DE   10 2015 107 864 A1    11/2015

(Continued)

OTHER PUBLICATIONS

Extended European Search Report dated Jan. 9, 2018 in corresponding application No. 17193949.9.

*Primary Examiner* — Tuyen K Vo
(74) *Attorney, Agent, or Firm* — Foley & Lardner LLP

(57) ABSTRACT

A method for manufacturing a linear light emitting device includes: providing a light transmissive member having a long side and a short side in a plan view; mounting a plurality of light emitting elements on the light transmissive member via a light transmissive adhesive, such that the light emitting elements are arranged in a row along the long side of the light transmissive member; and forming a reflective member that covers the light transmissive adhesive and lateral faces of the light emitting elements. The linear light emitting device has an emission face having a long side and a short side in a plan view, and a length of the short side of the light transmissive member is substantially equal to a length of the short side of the emission face of the linear light emitting device.

20 Claims, 12 Drawing Sheets

(51) Int. Cl.
*H01L 25/075* (2006.01)
*F21V 8/00* (2006.01)
*H01L 33/56* (2010.01)

(56) References Cited

U.S. PATENT DOCUMENTS

| | | | |
|---|---|---|---|
| 2009/0230408 A1* | 9/2009 | Meng | H01L 27/14618 257/81 |
| 2011/0309388 A1 | 12/2011 | Ito et al. | |
| 2012/0140506 A1 | 6/2012 | Waragawa et al. | |
| 2012/0236582 A1 | 9/2012 | Waragaya et al. | |
| 2013/0240934 A1* | 9/2013 | Park | H01L 33/60 257/98 |
| 2013/0249388 A1 | 9/2013 | Ryowa et al. | |
| 2014/0001948 A1* | 1/2014 | Katayama | F21V 13/02 313/498 |
| 2014/0319560 A1* | 10/2014 | Tischler | H01L 29/00 257/98 |
| 2015/0001548 A1* | 1/2015 | Okamura | H01L 33/58 257/76 |
| 2015/0102366 A1* | 4/2015 | Wada | H01L 33/505 257/88 |
| 2015/0188004 A1* | 7/2015 | Ozeki | H01L 33/507 257/98 |
| 2015/0263254 A1* | 9/2015 | Miyoshi | H01L 33/505 257/98 |
| 2015/0333241 A1 | 11/2015 | Chen et al. | |
| 2016/0093781 A1 | 3/2016 | Tamaki et al. | |
| 2016/0118548 A1 | 4/2016 | Kawaguchi et al. | |
| 2017/0069682 A1 | 3/2017 | Chen et al. | |
| 2017/0338278 A1 | 11/2017 | Chen et al. | |
| 2018/0040583 A1 | 2/2018 | Tamaki et al. | |

FOREIGN PATENT DOCUMENTS

| | | |
|---|---|---|
| EP | 3 012 878 A1 | 9/2015 |
| JP | 2004-235139 A | 8/2004 |
| JP | 2010-219324 A | 9/2010 |
| JP | 2012-004303 A | 1/2012 |
| JP | 2012-204438 A | 10/2012 |
| JP | 2012-227470 A | 11/2012 |
| JP | 2013-197530 A | 9/2013 |
| JP | 2014-110333 A | 6/2014 |
| JP | 2014-139979 A | 7/2014 |
| JP | 2016-086166 A | 5/2016 |
| JP | 2016-115703 A | 6/2016 |
| JP | 2016-115729 A | 6/2016 |

* cited by examiner

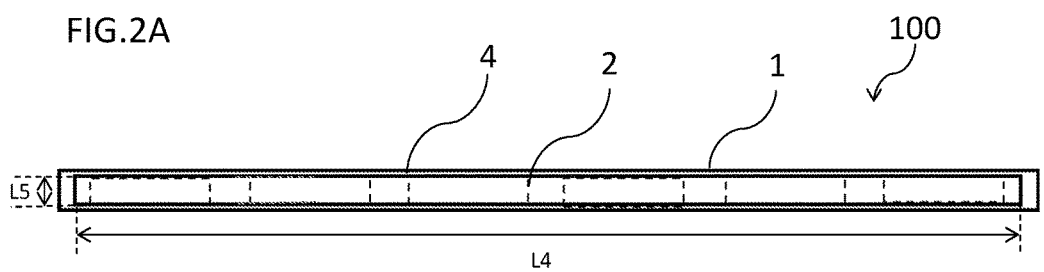
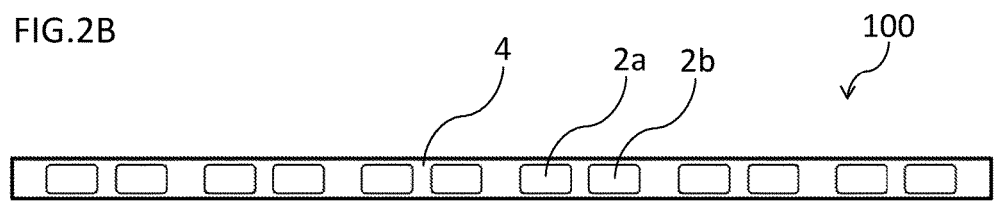
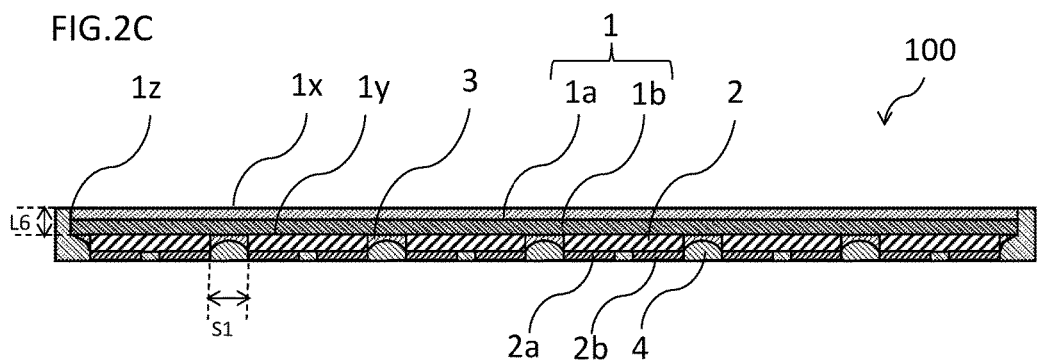

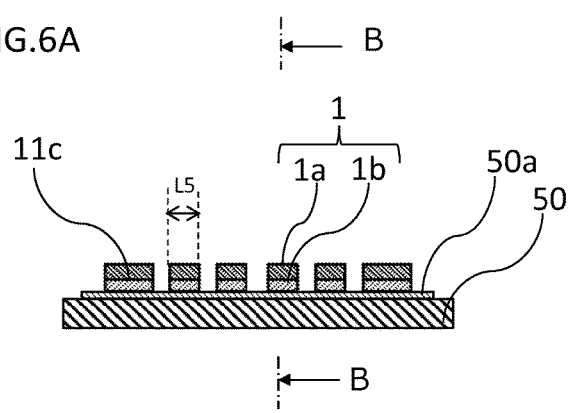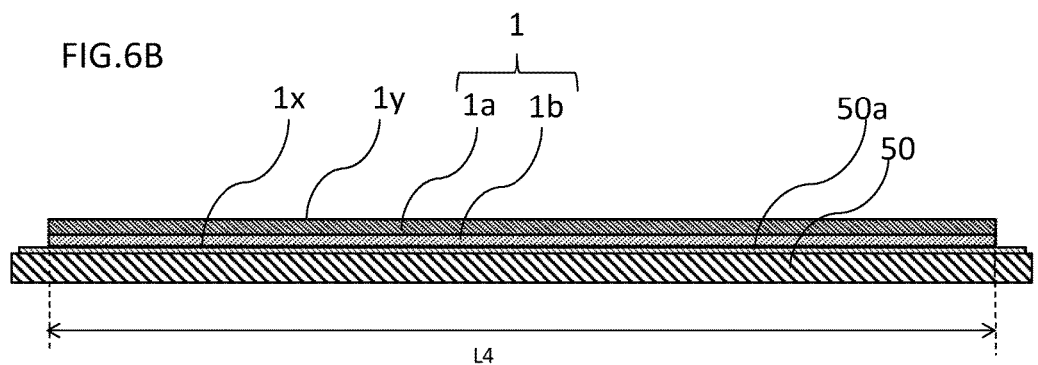

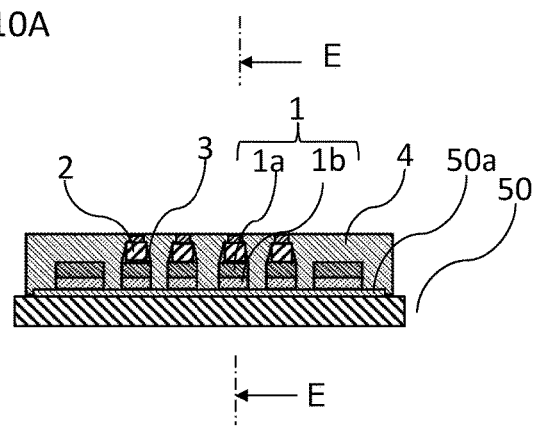
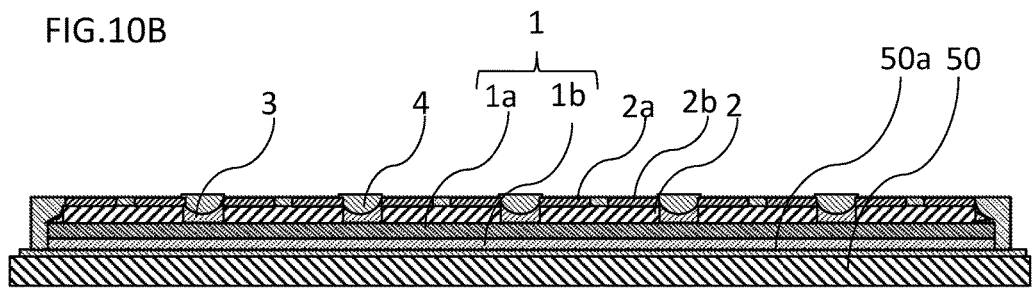

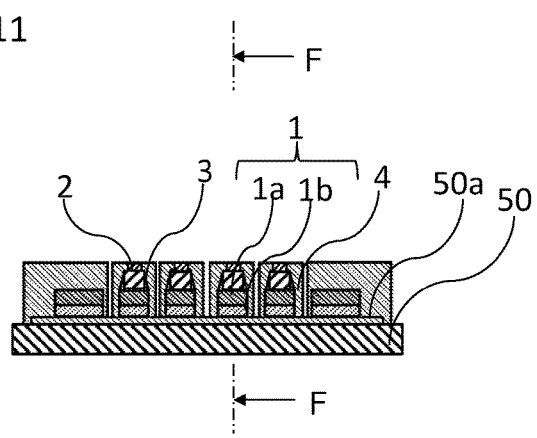
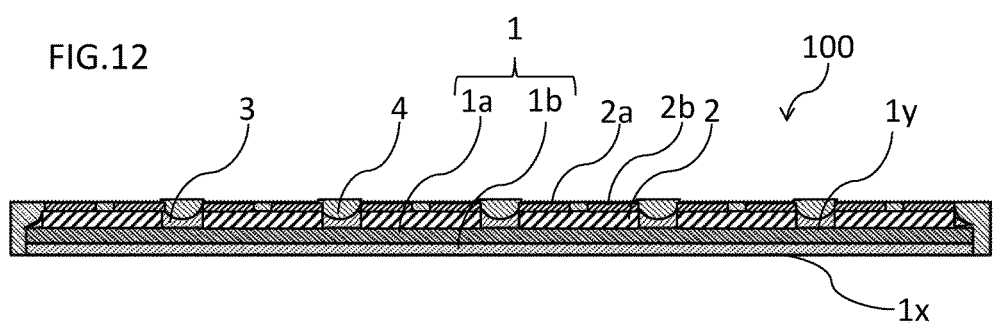

METHOD FOR MANUFACTURING LINEAR LIGHT EMITTING DEVICE AND LINEAR LIGHT EMITTING DEVICE

CROSS-REFERENCE TO RELATED APPLICATION

This application claims priority to Japanese Patent Application No. 2016-194501, filed on Sep. 30, 2016, the disclosure of which is hereby incorporated by reference in its entirety.

BACKGROUND

The present disclosure relates to a method for manufacturing a linear light emitting device, and a linear light emitting device.

In the past, linear light emitting devices that have a plurality of light emitting elements and are suited for use as backlights for cellular phones, digital cameras, and the like have been proposed as shown, for example, in Japanese Unexamined Patent Application Publication No. 2004-235139. In the linear light emitting device disclosed in Japanese Unexamined Patent Application Publication No. 2004-235139, a plurality of light emitting elements are disposed along the long side of a narrowly elongated square bar shaped wiring substrate at certain intervals by die bonding, and reflectors are disposed on both sides of each light emitting element so that they alternate. The two opposing faces of the reflectors interposing each light emitting element are oblique so as to increase the open area in the direction of emission, thereby promoting miniaturization and thickness reduction of the device as a whole, while producing highly luminous linear light with reduced luminance variance.

SUMMARY

The linear light emitting device disclosed in the above cited patent publication, however, does not fully meet the recent miniaturization and thickness reduction requirements for a backlight. Moreover, manufacturing of such a linear light emitting device becomes more difficult as its thickness becomes smaller.

The concepts described in this disclosure have been developed in view of the problems discussed above, and one object of certain embodiments described herein is to provide a simplified method for manufacturing a thin-type linear light emitting device, and a thin-type light emitting device.

According to one embodiment, a method for manufacturing a linear light emitting device includes: preparing a light transmissive member having a long side and a short side in a plan view, the short-side length being substantially equal to the short-side length of the emission face of the linear light emitting device; mounting a plurality of light emitting elements, arranged in a row along the long side of the light transmissive member, on the light transmissive member via a light transmissive adhesive; and forming a reflective member that covers the light transmissive adhesive and the lateral faces of the plurality of light emitting elements.

According to another embodiment, a linear light emitting device includes: a plurality of light emitting elements each having a long side and a short side in a plan view; a light transmissive member having a long side and a short side in a plan view; a light transmissive adhesive that adheres the light emitting elements to the light transmissive member; and a reflective member that covers the light transmissive adhesive and the lateral faces of the light emitting elements, wherein the plurality of light emitting elements are arranged in a row so that the long side coincides with the long side of the light transmissive member, and the light transmissive adhesive is disposed between the lateral faces of adjacent light emitting elements.

In this way, a thin-type linear light emitting device can be manufactured in a simplified manner.

BRIEF DESCRIPTION OF THE DRAWINGS

FIG. 2A is a schematic plan view of the linear light emitting device according to the embodiment.

FIG. 2B is a schematic bottom view of the linear light emitting device according to the embodiment.

FIG. 2C is a schematic cross-sectional view of the linear light emitting device according to the embodiment.

FIG. 6A is a schematic cross-sectional view explaining a step in the method for manufacturing a linear light emitting device according to the embodiment.

FIG. 6B is a schematic cross-sectional view taken along line B-B in FIG. 6A.

FIG. 10A is a schematic cross-sectional view explaining a step in the method for manufacturing a linear light emitting device according to the embodiment.

FIG. 10B is a schematic cross-sectional view taken along line E-E in FIG. 10A.

FIG. 11 is a schematic cross-sectional view explaining a step in the method for manufacturing a linear light emitting device according to the embodiment.

FIG. 12 is a schematic cross-sectional view explaining a step in the method for manufacturing a linear light emitting device according to the embodiment.

DETAILED DESCRIPTION

Figure 1A:
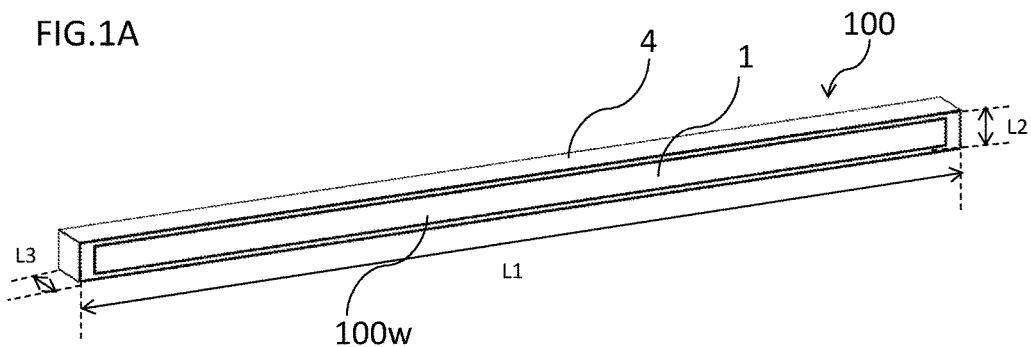
FIG. 1A is a schematic perspective view of a linear light emitting device according to an embodiment.

Certain embodiments of the present invention will be explained below with reference to the accompanying drawings. The light emitting devices explained below, however, are for the purpose of embodying the technical concepts of the invention, and the present invention is not limited to those explained unless otherwise specifically noted. Moreover, the descriptions of one embodiment or example are also applicable to other embodiments or examples. The sizes of the components, aspect ratios, and positional relationship, or the like shown in the drawings might be exaggerated or omitted for clarity of explanations and making the invention easily understood.

The term "thickness reduction" herein refers to the reduction of the short-side length of the linear light emitting device's light extraction face, which has a short side and a long side, and the term "thin-type linear light emitting device" refers to a linear light emitting device in which this short-side length is small.

A "face on the light extraction side" herein refers to each component's face on the light extraction side when incorporated into a linear light emitting device.

In one embodiment, a method for manufacturing a linear light emitting device includes: preparing a light transmissive member having a long side and a short side in a plan view, the short-side length being substantially equal to the short-side length of the emission face of the linear light emitting device; mounting a plurality of light emitting elements, arranged in a row along the long side of the light transmissive member, on the light transmissive member via a light transmissive adhesive; and forming a reflective member that covers the light transmissive adhesive and the lateral faces of the plurality of light emitting elements.

By using the light transmissive member, which has been formed to a shape having a long side and a short side, as the emission face of the light emitting device in this manner, the accuracy of the position and the shape of the emission face can be improved. Furthermore, by mounting a plurality of light emitting elements on the light transmissive member using a light transmissive adhesive, the light emitting elements can be highly accurately aligned even when the width of the light transmissive member which serves as the emission surface is small. In this manner, a thin-type light emitting device can be manufactured.

First Embodiment

FIG. 1A to FIG. 2C show the linear light emitting device 100 produced by the manufacturing method according to a first embodiment. The light emitting device has a plurality of light emitting elements 2 each having a long side and a short side in a plan view; a light transmissive member 1 having a long side and a short side in a plan view; a light transmissive adhesive 3 for bonding the light emitting elements 2 and the light transmissive member 1; and a reflective member 4 that covers the light transmissive adhesive 3 and the lateral faces of the light emitting elements 2. The light emitting elements 2 are arranged in a row so that the long side coincides with the long side of the light transmissive member 1, and the light transmissive adhesive 3 is disposed between the lateral faces of adjacent light emitting elements 2.

In recent years, for an electronics device having a backlight that employs a light emitting device as its light source, there has been a growing demand for a narrower bezel display panel (to enlarge the effective display area of a panel) to increase the ratio of the display area to the panel surface. In the case where a light emitting device having multiple light emitting elements arranged therein is used as the light source of a backlight, because the intensity and the hue of the light emitted from the light emitting device has angle dependency, the brightness and the color tone vary greatly in the vicinity of the light emitting device, which is not a suitable display area. For this reason, a certain distance from the light emitting device was unusable as a display area, which made it difficult to enlarge the display area.

When constructed as discussed earlier, however, the light emitted from a plurality of light emitting elements 2 is made uniform in the light transmissive adhesive 3 disposed between the light emitting elements 2 before entering the light transmissive member 1, and the light is emitted substantially uniformly from the surface of the light transmissive member 1. Since this can reduce the angle dependency of the intensity and the hue of the light emitted from the linear light emitting device 100, such a linear light emitting device 100 can be disposed near the light guide plate of the backlight. This allows for the backlight to have a narrow frame, thereby enlarging the display area. Thus, a display device equipped with the linear light emitting device 100 according to the present embodiment can have an enlarged display area.

A method for manufacturing the linear light emitting device 100 according to the present embodiment will be explained in detail below.

1. Preparing a Light Transmissive Member

First, a light transmissive member is prepared that has a long side and a short side in a plan view where the short-side length is substantially equal to the short-side length of the emission face of the linear light emitting device 100. The light transmissive member is prepared so that the short-side length of one face is substantially equal to the short-side length of the emission face of the linear light emitting device. This face will be used as the emission face of a linear light emitting device. In the present embodiment, the light transmissive member is formed so that the short-side length of the light extraction face that opposes the support (described later) is substantially equal to the short-side length of the emission face of the linear light emitting device.

In this embodiment, as described below, the preparation of a light transmissive member having a long side and a short side in a plan view is carried out by forming the base material for the light transmissive members on a support, and cutting the base material into multiple light transmissive members.

The short-side length of the light transmissive member's face being "substantially equal" to the short-side length of the emission face of the linear light emitting device herein refers to the difference between the short-side length of the emission face of the linear light emitting device and the short-side length of the light transmissive member being within about plus or minus 10% of the emission face's short-side length.

1-1. Forming the Base Material for the Light Transmissive Member

Figure 3A:
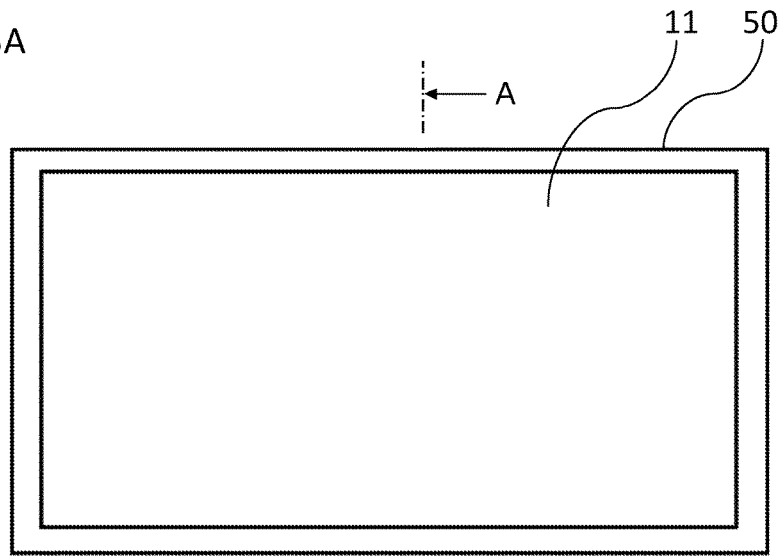
FIG. 3A is a schematic plan view of the base material for the light transmissive members according to the embodiment.
Figure 4:
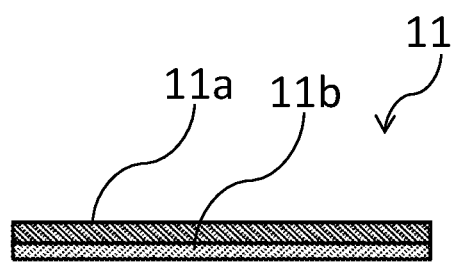
FIG. 4 is a schematic cross-sectional view explaining a step in the method for manufacturing a linear light emitting device according to an embodiment.

First, as shown in FIG. 3A and FIG. 4, a sheet-shaped base material 11 for the light transmissive members is formed. The sheet-shaped base material 11 for the light transmissive members can be formed, for example, with a liquid resin which contains phosphor particles mixed therein as needed by way of coating, compression molding, transfer molding, injection molding, spraying, printing, or potting, or impregnating a phosphor sheet formed to a uniform thickness with a resin by electrophoretic deposition, or the like.

1-2. Mounting the Base Material for the Light Transmissive Member on a Support

Figure 5:
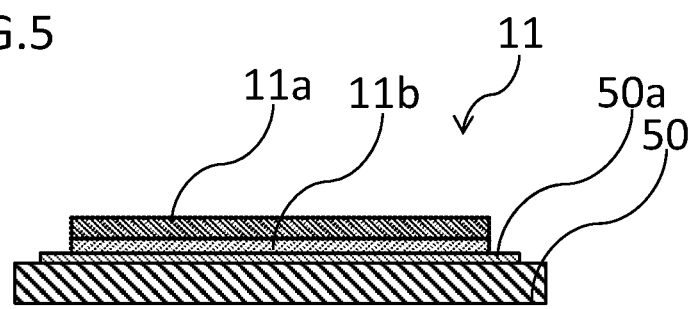
FIG. 5 is a schematic cross-sectional view explaining a step in the method for manufacturing a linear light emitting device according to the embodiment.

Next, as shown in FIG. 5, the sheet-shaped base material 11 for the light transmissive members thus formed is mounted on a support 50. In this embodiment, the base material 11 for the light transmissive members is adhered on the support equipped with a pressure sensitive adhesive layer 50a with the light extraction side up. For the support 50, a resin film, metal sheet, resin sheet, ceramic sheet, or the like can be used singly or in combination. The support 50, regardless of the material, preferably has a pressure sensitive adhesive layer, more preferably a UV curable pressure sensitive adhesive layer, on one side. By using such a pressure sensitive adhesive layer 50a, the base material 11 for the light transmissive members or a prepared light transmissive member 1 can be stably held on the support 50. Furthermore, the support 50 is preferably heat resistant because it will have a thermal history in the subsequent steps such as when curing a resin. The mounting of the base material 11 for the light transmissive members may be substituted by forming the base material 11 for the light transmissive members on a support 50.

1-3. Cutting the Base Material for the Light Transmissive Members

Figure 3B:
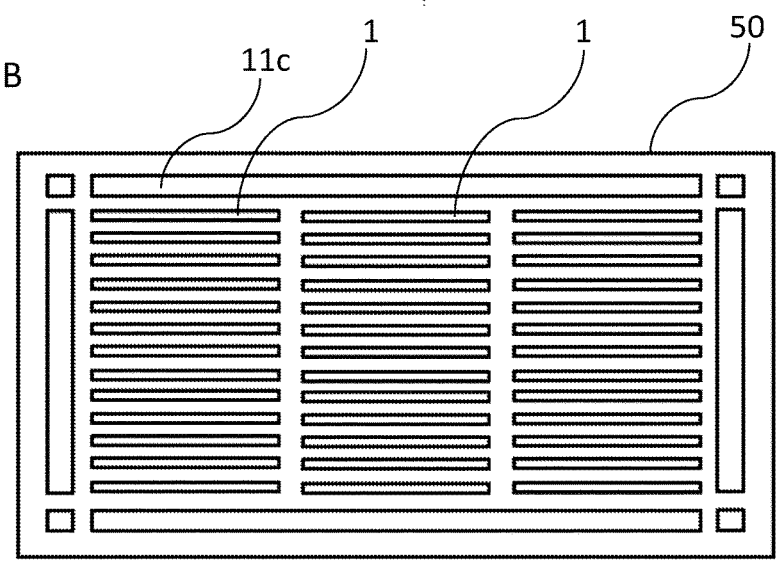
FIG. 3B is a schematic plan view of the light transmissive members according to the embodiment.

Next, as shown in FIG. 3B, FIG. 6A, and FIG. 6B, the base material 11 for the light transmissive members is cut while being mounted on the support 50 to form a plurality of light transmissive members 1 each having a long side and a short side in a plan view.

For the method for cutting the base material 11 for the light transmissive members, dicing, Thomson machining, ultrasonic machining, laser machining, or the like can be used. Dicing is particularly preferable because of its high linear motion quality described later and for spacing adjacent light transmissive members 1 apart.

The cutting step effectively defines the shape of the emission face 100w of a linear light emitting device, particularly the long sides (side L4 in FIG. 2A) in a plan view, and it is thus preferable to use a good linear motion cutting method. If such linear motion cannot be ensured, the shape of the emission face 100w of the linear light emitting device 100 might not turn out as desired. Moreover, in the case where the lateral faces of the light transmissive member (1z in FIG. 2C) are covered with the reflective member 4 described later, such shape variance of the light transmissive member 1 makes it difficult to control the thickness of the reflective member 4. As a consequence, the reflective member 4 would not be able to fully control the emission directions and likely degrade the properties of the linear light emitting device 100, including the luminous intensity and the efficiency of light entering the light guide plate.

The accuracy of the linearity of the long sides of the light transmissive member 1 required would depend on the thickness of the reflective member 4 that covers the lateral faces of the light transmissive member 1. In order to obtain a thin-type linear light emitting device 100 with high output, in particular, the short-side length (side L5 in FIG. 2A) of the light transmissive member which serves as the emission face should be large and the thickness of the reflective member 4 should be small. Thus, the light transmissive member 1 should be formed by being cut while maintaining a high degree of linearity across the entire length of the linear light emitting device 100. Specifically, the cut surface of the light transmissive member is preferably linear enough to allow for the reflective member to be disposed to a thickness of about 20 μm to 100 μm, preferably about 50 μm, on the entire lateral faces 1z of the light emitting device 100.

The degree of linearity of a member being high herein refers to the distance between the virtual line going through the innermost peripheral point of a certain side of a member and the outermost peripheral point of the member being small.

"High linear motion cutting" herein refers to the ability to cut a member with a high degree of linearly.

In cutting the base material 11 for the light transmissive members, by cutting part of the base material 11 for the light transmissive members to be removed, and thus forming the light transmissive members 1 spaced apart, spaces can be created for disposing the reflective member 4 on the lateral faces of the light transmissive members 1. In this manner, the spaces for providing the reflective member 4 can be created without transferring the light transmissive members 1 or expanding the sheet as described later. This can be achieved by a cutting method such as dicing that provides cutting margins. The spacing is sufficient if it can accommodate the thickness of the reflective member 4 to be disposed and is suited for the method for cutting the reflective layer 4. The spacing is preferably, for example, about 10 to 300 μm, more preferably about 100 to 200 μm. This can achieve a thin-type linear light emitting device 100 while ensuring the thickness of the reflective member 4.

When cutting the light transmissive members 1, remnants 11c of the light transmissive material can be generated as shown in FIG. 3B. The remnants 11c of the light transmissive material are parts that cannot be utilized as light transmissive members 1 for reasons such as insufficient length for a light transmissive member 1 or ununiform thickness of the base material 11 for the light transmissive members. The remnants 11c of the light transmissive material are created, for example, in the peripheral portions of the base material 11 for the light transmissive members. The remnants 11c may be removed after the step of cutting the light transmissive members. Alternatively, the remnants can remain as is, and in this case, the remnant removing step can be eliminated. This can also prevent the formed light transmissive members 1 from being damaged or bent by coming into contact with the remnants in the process of being removed. This facilitates the production of the linear light emitting devices 100.

Besides the method which includes cutting described above, the light transmissive member 1 can be prepared by being formed into the shape of the light transmissive member 1 from the beginning, without cutting. Examples of such methods that can be used include transfer molding, compression molding, screen printing, or the like.

The base material for the light transmissive members may be shaped to have protruded portions, which will become the light transmissive members, and a base portion which connects the protruded portions. Such a base material for the light transmissive members can be formed by creating grooves in the sheet-formed base material for the light transmissive members which has a substantially consistent thickness. In this way, linear light emitting devices can be manufactured in a more simplified manner than the case of handling separated light transmissive members.

In this case, only the protrusions may be used as the light transmissive members by removing the base portion in the manufacturing process. In this case, the surface of a protruded portion to be exposed after removing the base portion is formed to substantially the same shape as the emission face of the light emitting device.

The second face 1y of the light transmissive member 1 on which light emitting elements 2 are mounted may have a different shape from the shape of the opposite face, i.e., the first face 1x which will serve as the emission face of the linear light emitting device. For example, the second face 1y where the light emitting elements 2 are mounted may be smaller or larger than the first face 1x. The light transmissive member having such a shape can be formed, for example, by using a v shaped or inverse v shaped blade in cutting the base material 11 for the light transmissive members in the present embodiment.

2. Mounting Light Emitting Elements on Light Transmissive Member

Next, a plurality of light emitting elements 2, arranged in a row along the long side of the light transmissive member 1, are mounted on the light transmissive members 1 via a light transmissive adhesive 3.

The face of the light transmissive member 1 on which light emitting elements 2 are mounted is occasionally referred to as an upper face herein.

In the present embodiment, the light emitting elements 2 are mounted on individual light transmissive members 1 in the state where the plural light transmissive members 1 prepared by being formed (cut) on the support 50 remain being held on the support 50, i.e., without transferring or remounting the light transmissive members 1 from the support 50. The light transmissive member 1 made of a resin, particularly silicone resin, as a base material is soft. In addition, the light transmissive member 1 which will be the emission face is formed into a narrowly elongated shape in order to achieve a thin-type linear light emitting device 100. It is generally difficult to transfer or remount such members. Particularly, a soft and narrowly elongated light transmissive members 1 could be twisted or bent while being transferred or remounted. This makes it extremely difficult to maintain the linearity of the light transmissive member 1 described earlier. For this reason, it is preferable to cut the light transmissive members 1 on the support 50, and mount the light emitting elements 2 on the light transmissive members 1 without transferring or remounting them from the support 50 used for cutting, i.e., while being held on the same support 50.

2-1. Coating Liquid Resin Material

Figure 7A:
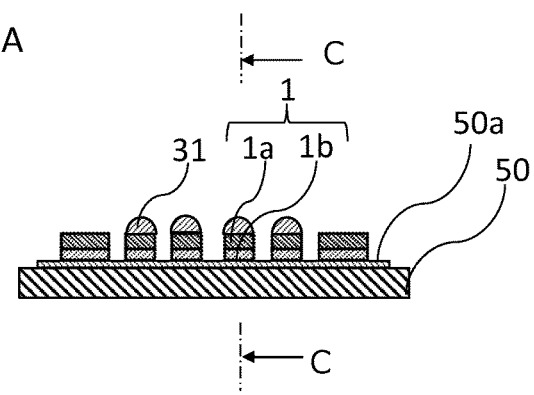
FIG. 7A is a schematic cross-sectional view explaining a step in the method for manufacturing a linear light emitting device according to the embodiment.
Figure 7B:
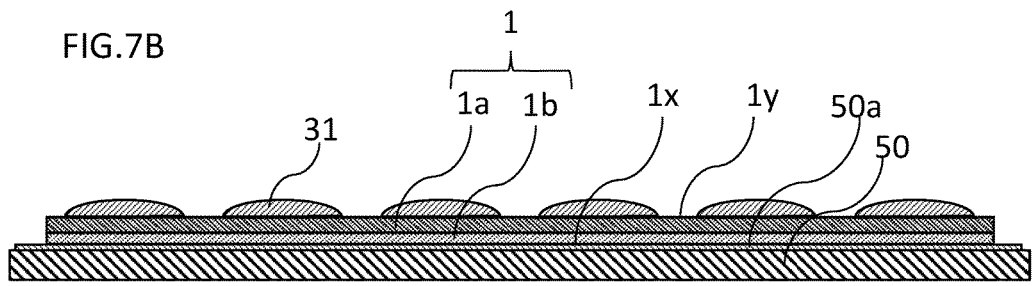
FIG. 7B is a schematic cross-sectional view taken along line C-C in FIG. 7A.

In the step of mounting light emitting elements 2 on the light transmissive members 1 in this embodiment, a liquid resin material 31 which becomes the light transmissive adhesive 3 when cured, is first applied to the upper face of each light transmissive member 1 as shown in FIG. 7A and FIG. 7B.

The resin can be applied by pin transfer, dispensing, printing, or the like. The liquid resin material 31 to be applied can be disposed on the light transmissive members 1 in the form of islands, a series of lines, or the like as shown, for example, in FIG. 7A and FIG. 7B.

The amount that is sufficient to adhere the light emitting elements 2 to the light transmissive members 1 is applied, which can be suitably adjusted in accordance with the sizes of the light transmissive members 1 and the light emitting elements 2, the number of light emitting elements, the strength of adhesion, or the like. It is preferable to dispose the light transmissive adhesive 3 in contact with the lateral faces of the light emitting elements 2 in addition to between the light extraction side faces of the light emitting elements 2 and the light transmissive member 1. This allows for the extraction of light from the lateral faces of the light emitting elements 2 thereby increasing the light extraction efficiency of the linear light emitting device 100. As shown in FIG. 2C, moreover, the light transmissive adhesive 3 is preferably present continuously between the adjacent light emitting elements 2, i.e., the light transmissive member 3 is formed so as to link a lateral face of a light emitting element 2 and the adjacent lateral face of another light emitting element 2. This can homogenize the light emitted from the plurality of light emitting elements 2 inside the light transmissive adhesive 3. This thus can reduce the variance of the light emitted from the linear light emitting device 100. Accordingly, it is preferable to apply an adequate amount of the liquid resin material 31 so that the light transmissive adhesive 100 will be continuously present between adjacent light emitting elements 2.

2-2. Arranging Light Emitting Elements

Figure 8A:
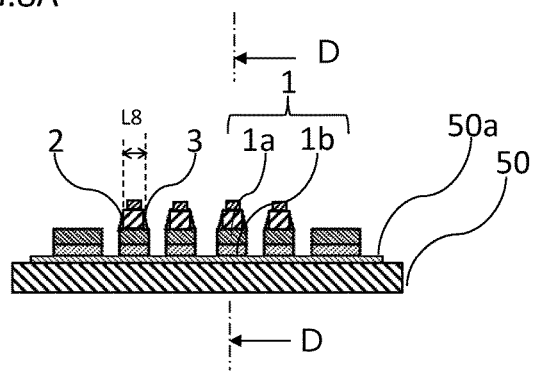
FIG. 8A is a schematic cross-sectional view explaining a step in the method for manufacturing a linear light emitting device according to the embodiment.
Figure 8B:
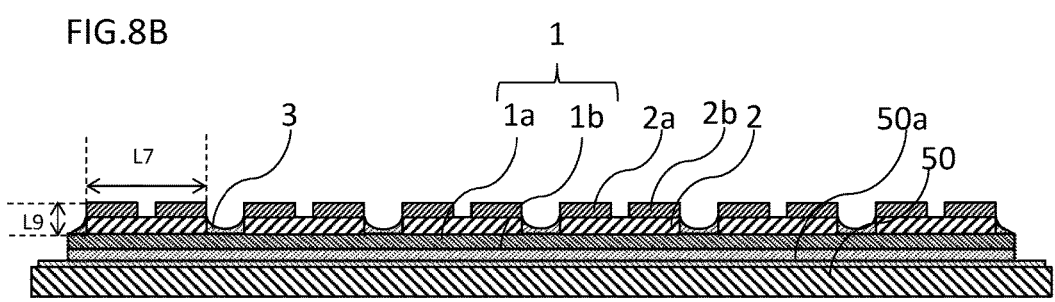
FIG. 8B is a schematic cross-sectional view taken along line D-D in FIG. 8A.

Next, as shown in FIG. 8A and FIG. 8B, a plurality of light emitting elements 2 are arranged on the liquid resin material 31. As shown in FIG. 8B, the light emitting elements are preferably arranged so that their long side (side L7 of FIG. 13A) coincides with the long side of the light transmissive member. The distance between two adjacent light emitting elements (S1 in FIG. 2C) can be set to about 10 μm to about 1000 μm, preferably 200 μm to 800 μm, for example, more preferably about 500 μm. Furthermore, the distance is preferably about 0.5 to 1 times the long-side length L7 of the light emitting element. By setting the distance Si between the light emitting elements to about 0.5 to 1 times the long-side length of the light emitting element in this manner, the number of light emitting elements 2 to be mounted on a single linear light emitting device 100 can be reduced. This simplifies the manufacturing method for and reduces the raw materials costs of the linear light emitting device 100.

When arranging the light emitting elements 2, it is preferable to perform the positioning of the light emitting elements 2 and the liquid resin material 31 which becomes the light transmissive adhesive 3 using the edges of the light transmissive member 1 in a plan view. For example, it is preferable to have the edges of the long sides of the light transmissive member 1 coincide with the edges of the light transmissive adhesive 3. By allowing the light emitting elements 2 to be self-aligned along the long side of the light transmissive member 1, the light emitting elements 2 can be easily and precisely mounted in a row on the narrow-width light transmissive member 1.

Figure 13A:
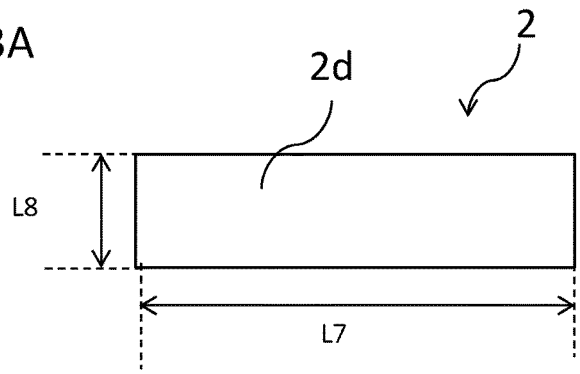
FIG. 13A is a schematic plan view of a light emitting element according to the embodiment.

It is preferable to set the short-side length of the light transmissive member (L5 in FIG. 2A) to about 1 to 2 times, more preferably about 1.2 to 1.5 times, the short-side length of the light emitting element 2 (L8 in FIG. 13A). This can produce a thin-type linear light emitting device 100 while achieving the self-alignment effect.

2-3. Curing Liquid Resin Material

Next, the liquid resin material 31 is cured by heat or UV rays to adhere the light transmissive member 1 to the plurality of light emitting elements 2. At this time, it is preferable to form the light transmissive adhesive 3 to a shape that spreads from the lower face 2y of a light emitting element 2, which is opposite the face 2x on the light extraction side facing the light transmissive member 1, towards the light transmissive member 1. This can result in a high light extraction efficiency linear light emitting device 100.

3. Forming Reflective Member

Next, as shown in FIGS. 9A, 9B, 10A, and 10B, a reflective member 4 that covers the lateral faces of the plurality of light emitting elements 2 and the light transmissive adhesive 3 is formed. The formation of the reflective member 4 is preferably performed also on the same support 50 which was used in cutting the light transmissive members 1. This reduces the deformation of a light transmissive member 1 and results in a highly precisely formed reflective member even for a linear light emitting device 100 having a narrow short-side width. In the present embodiment, a plurality of light transmissive members 1 adhered to the support 50 each having a plurality of light emitting elements 2 and a light transmissive adhesive 3 mounted thereon are collectively covered with a single reflective member 4.

The reflective member 4 can be formed using various molding methods, such as compression molding, transfer molding, or injection molding, or other methods such as printing or potting. Compression molding or transfer molding is best suited because the fluidity of the resin employed to form the reflective member 4 worsens as the concentration of the fillers contained in the resin increases.

The reflective member 4 may be formed to cover the light transmissive adhesive 3 and the lateral faces of the plurality of light emitting elements 2, or to cover the light transmissive adhesive 3, the lateral faces of the light emitting elements 2, and the lateral faces of the light transmissive member 1.

The reflective member 4 may be formed in parts. For example, the reflective member that covers the lateral faces of the light transmissive member 1 may be formed before mounting the light emitting elements 2, and the reflective member that covers the lateral faces of the light emitting elements and the light transmissive adhesive may be formed after mounting the light emitting elements.

If the remnants 11c of the light transmissive material remain on the support 50, they can also be covered with the reflective member 4. This securely fixes the remnants 11c of the light transmissive material in position and facilitates the step of disposing the remnants 11c as well as the cutting step to separate the light emitting devices into individual pieces described later.

Figure 9A:
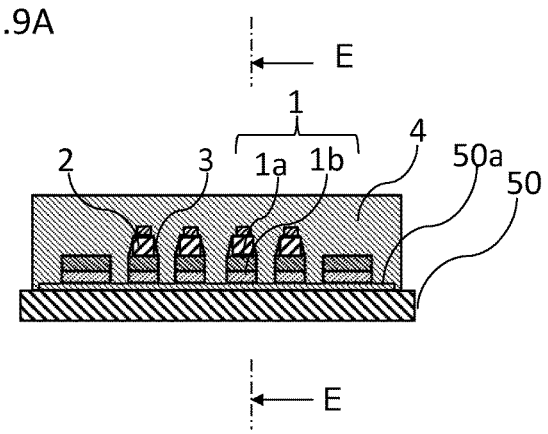
FIG. 9A is a schematic cross-sectional view explaining a step in the method for manufacturing a linear light emitting device according to the embodiment.
Figure 9B:
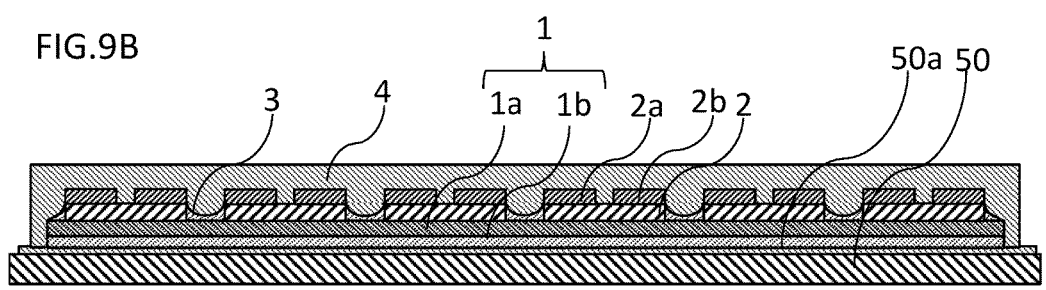
FIG. 9B is a schematic cross-sectional view taken along line E-E in FIG. 9A.

The reflective member 4 may be formed into a shape to expose the pair of electrodes 2a and 2b of each light emitting element 2. Alternatively, it may be formed to cover the electrodes 2a and 2b as shown in FIGS. 9A and 9B, and subsequently be ground to expose the electrodes as shown in FIGS. 10A and 10B.

5. Separating Linear Light Emitting Devices into Individual Pieces

In the present embodiment, the reflective member 4 that collectively covers a plurality of light transmissive members 1 each having a plurality of light emitting elements 2 and a light transmissive adhesive 3 mounted thereon is cut to obtain a plurality of linear light emitting devices 100 separated into individual pieces. It is preferable to perform this cutting or separation on the same support described above as shown in FIG. 11. For the cutting method, dicing, Thomson machining, ultrasonic machining, laser machining, or the like can be employed.

In the step of separating the light emitting devices into individual pieces, the degradation of linearity attributable to deformation of the light transmissive members 1 does not pose a problem because the light transmissive members 1 are securely fixed by the reflective member 4. Accordingly, in the step of separating the light emitting devices into individual pieces, the subject can be transferred or remounted onto another support. For example, by transferring the subject onto another support to cut the reflective member in the state where the light transmissive members 1 are exposed, the cutting step can be performed while checking the position of each light transmissive member 1 and the thickness of the reflective member 4. This enables steady production of linear light emitting devices 100.

In the step of separating the light emitting devices into individual pieces, the light transmissive members 1 may be cut along the short-side direction (i.e., in the direction intersecting the long-side direction). This can produce linear light emitting devices 100 of various lengths.

Subsequently, the support 50 is removed as shown in FIG. 12.

The linear light emitting device 100 according to the present embodiment of the invention can be obtained as described above.

Suitable materials for each component of the linear light emitting device 100 according to the present embodiment will be explained below.

Light Transmissive Member 1

For the base material for the light transmissive member 1, a light transmissive resin, glass, or the like can be used. Since the linear light emitting device 100 according to the present embodiment is extremely narrow and long, it can be very vulnerable to the bending stress subjected to during the manufacturing process for the linear light emitting device 100, as well as the assembly process for a lighting device (backlight). For this reason, if an inorganic material such as glass that can easily break is used for the light transmissive member 1, it can be readily damaged by the stress applied thereto during the manufacturing process for the linear light emitting device 100. In order to prevent this problem, it is preferable to use an organic material, particularly a resin having flexibility or adaptability to some degree, for the base material.

Examples of such resins include silicone resins, silicone modified resins, modified silicone resins, epoxy resins, phenol resins, polycarbonate resins, acrylic resins, TPX resins, polynorbornene resins, and hybrid resins containing one or more of these resins. Among all, silicone resins or epoxy resins are preferable, particularly, highly light resistant and heat resistant silicone resins are more preferable.

If glass or a sintered phosphor is used for the light transmissive member, the deterioration of the light transmissive member can be reduced. This thus can produce a highly reliable linear light emitting device. Such a linear light emitting device can be suitably employed as a light source, for example, for automotive headlights.

Preferably, the light transmissive member 1 contains a phosphor. In this way, the wavelength of the light emitted by the light emitting elements can be converted, producing a linear light emitting device capable of emitting various color tones, particularly white light. Any phosphors known in the art can be used. Examples of phosphors include cerium-activated yttrium aluminum garnet-based (YAG) phosphors, cerium-activated lutetium aluminum garnet-based (LAG) phosphors, europium- and/or chromium-activated nitrogen-containing calcium aluminosilicate-based ($CaO$—$Al_2O_3$—$SiO_2$) phosphors, europium-activated silicate-based (($Sr,Ba)_2SiO_4$) phosphors, β-SiAlON phosphors, KSF-based phosphors ($K_2SiF_6$:Mn), and semiconductor microparticles referred to as quantum dot phosphors. In this manner, a linear light emitting device can be produced to emit light of mixed color combining primary light and secondary light of visible wavelengths (e.g., white), or secondary light emitted after being excited by primary UV light. In the case where the linear light emitting device is used in a backlight of a liquid crystal display or the like, it is preferable to use a phosphor that is excited by the blue light emitted from the light emitting elements to emit red light (e.g., a KSF-based phosphor) or green light (e.g., a β-SiAlON phosphor). This can broaden the color reproduction range of the display device which employs the linear light emitting device 100. In the case where the light transmissive member 1 contains a KSF-based phosphor, providing a layer containing no KSF phosphor in a position closer to the light emission face 100w than the portion that contains the KSF phosphor can protect the KSF phosphor which is vulnerable to moisture or the like.

The location of the phosphor is not limited to the light transmissive member 1, and can be positioned or contained in various members of the linear light emitting device 100. For example, it can be stacked as a phosphor layer on a clear layer which contains no phosphor by coating or adhering thereto. Alternatively, a phosphor can be disposed within the light transmissive adhesive 3.

The light transmissive member 1 may further contain a filler, for example, a diffuser, coloring agent, or the like. Examples of fillers include silica, titanium oxide, zirconium oxide, magnesium oxide, magnesium carbonate, magnesium hydroxide, calcium carbonate, calcium hydroxide, calcium silicate, zinc oxide, barium titanate, aluminum oxide, iron oxide, chromium oxide, manganese oxide, glass, carbon black, crystals of or sintered phosphor, and a sintered body of a phosphor and a bonding material. The refractive index may be adjusted with a filler, for example, at least 1.8. In order to efficiently scatter light and achieve high light extraction efficiency, the refractive index is preferably at least 2, more preferably at least 2.5. Among all, titanium oxide is preferable because it is relatively stable against moisture, and has a high refractive index and good thermal conductivity.

The filler particles may be granular, spherical, hollow, or porous. The mean diameter (median diameter) of the particles is preferably about 0.08 to 10 μm which can highly efficiently achieve the scattering effect. The filler content, for example, is preferably about 10 to 60 wt % relative to the weight of the light transmissive member 1.

The size of the base material 11 for the light transmissive members can be suitably determined in accordance with the size of the light transmissive member 1, the manufacturing apparatus, or the like.

The size of the light transmissive member 1 can be suitably determined in accordance with the size of the linear light emitting device 100.

For example, the long-side length L4 can be about 50 to 500 times or about 100 to 450 times the short-side length L5. The method for manufacturing the linear light emitting device 100 according to the present embodiment can produce the light emitting device in a simplified manner even when it employs such a light transmissive member whose long-side length is extremely long as compared to the short-side length. Using a linear light emitting device 100 having such a narrowly elongated emission face 100w can produce a lighting device (backlight) in a simplified manner as compared to the case where a large number of light emitting devices are installed.

The long-side length L4 can specifically be about 2.5 cm to 13.6 cm, or about 4 cm to 10 cm. This requires only one light emitting device to be installed in a backlight, thereby simplifying the installation of the light emitting device and the production of the backlight.

The short-side length L5 can specifically be 200 to 400 μm, more preferably 200 to 300 μm. This can achieve a thin-type linear light emitting device 100.

The thickness of the light transmissive member 1 affects the height of the linear light emitting device 100 (L3 in FIG. 1A). The risk of the linear light emitting device being damaged increases, and the allowable phosphor content decreases, as the thickness becomes smaller. Thus, the thickness is suitably selected. The thickness, for example, is preferably about 10 to 300 μm, more preferably 30 to 200 μm.

The light transmissive member 1 or the base material 11 for the light transmissive member may be of a single layer, or may have a stack structure having a plurality of layers as needed, as shown in FIG. 2C. For example, a second layer containing no phosphor, which is a protective layer, may be formed on a first layer which contains a phosphor. A first layer containing a yellow light emitting phosphor and a second layer containing a red light emitting phosphor may be separately formed, which can subsequently be stacked to obtain a double-layered base material 11 for the light transmissive member. Alternatively, after forming a first layer, a second layer can be sprayed onto the first layer to achieve a double-layered light transmissive member 1.

In the case where the phosphor employed can be readily degraded by external factors such as moisture, such phosphor degradation can be attenuated by disposing a layer that does not contain the phosphor on the light extraction face side of the light transmissive member 1 to reduce the contact between the phosphor and the ambient air. Alternatively, a layer containing a filler, such as a diffuser, coloring agent, or the like can be disposed on the light extraction face side of the light transmissive member. Disposing such a filler-containing layer can control the luminous intensity distribution and reduce color variance of the emitted light. Moreover, the reliability of the linear light emitting device 100 can be improved by using a filler having a higher thermal conductivity than that of the base material to increase the thermal conductivity.

Examples of fillers include silica, titanium oxide, zirconium oxide, magnesium oxide, magnesium carbonate, magnesium hydroxide, calcium carbonate, calcium hydroxide, calcium silicate, zinc oxide, barium titanate, aluminum oxide, iron oxide, chromium oxide, manganese oxide, glass, carbon black, crystals or sintered compact of a phosphor, and a sintered compact of a phosphor and a bonding material. Preferably, a filler having a high refractive index is selected. For example, at least 1.8, and in order to efficiently scatter light and achieve high light extraction efficiency, the refractive index is preferably at least 2, more preferably at least 2.5. Among all, titanium oxide is preferable because it is relatively stable against moisture, and has a high refractive index and good thermal conductivity.

The filler particles may be granular, spherical, hollow, or porous. The mean diameter (median diameter) of the particles is preferably about 0.08 to 10 μm, which can highly efficiently achieve scattering effect. The filler content, for example, is preferably about 10 to 60 wt % relative to the weight of the light transmissive member.

In the case where the light transmissive member 1 is produced from a liquid material such as a liquid resin containing phosphor particles, it is preferable to mix microparticles, such as AEROSIL®, into the light transmissive member 1. This can create a thixotropic material for the light transmissive member 1 which reduces the settling of the phosphor particles, thereby forming a base material 11 for the light transmissive member in which phosphor particles are uniformly dispersed.

Light Emitting Element 2

A plurality of light emitting elements 2 are mounted on a single light transmissive member 1.

The size, shape, and emission wavelength of the light emitting elements 2 can be suitably selected. The plurality of light emitting elements 2 may be irregularly arranged, or regularly arranged in a row or a column. In order to reduce the emission intensity variance and color variance, the light emitting elements are preferably arranged regularly at substantially equal intervals S1 as shown in FIG. 2C.

Figure 1B:
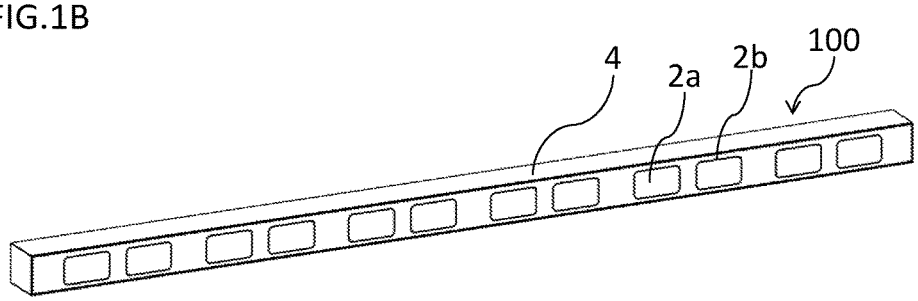
FIG. 1B is a schematic perspective view of the linear light emitting device according to the embodiment.

The plurality of light emitting elements 2 can be connected in series, parallel, or combination of series and parallel. As shown in FIG. 1B, the light emitting elements 2 may be produced in the state where they are electrically separated to be electrically connected via a mounting substrate 60 on which the linear light emitting device 100 is mounted. The plurality of light emitting elements 2 can be serially connected by providing a conductive metal film for respectively connecting the positive electrodes 2a, and the negative electrodes 2b of the light emitting elements 2.

The long-side length L7 of a light emitting element can be set, for example, to about 200 μm to 1500 μm. It is preferably set to about 500 μm to 1200 μm, more preferably about 700 μm to 1100 μm.

The short-side length L8 of a light emitting element can be set, for example, to about 50 μm to 400 μm. It is preferably set to about 100 μm to 300 μm. This enables the installation of the light emitting elements in a thin-type linear light emitting device 100.

Using the light emitting elements 2 having the long-side length L7 of at least three times, preferably at least five times the short-side direction L8 can facilitate the production of a linear light emitting device 100 which has a large long-side length L1 without increasing the number of light emitting elements 2. Using the light emitting elements 2 having the long-side length L7 of about three to six times the short-side direction L8 reduces the risk of damaging the light emitting elements 2 during the production, thereby simplifying the manufacturing process of the linear light emitting device 100.

The thickness L9 of a light emitting element 2 is preferably set, for example, to about 80 μm to 200 μm. This can reduce the width of the frame of a backlight when the linear light emitting device 100 is incorporated into the backlight, for example, in the case of mounting the linear light emitting device so that the incident face of the light guide plate is in parallel to the emission face 100w.

Figure 13B:
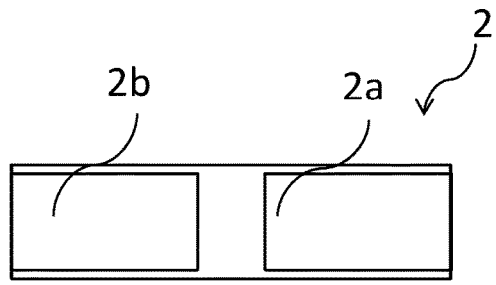
FIG. 13B is a schematic bottom view of the light emitting element according to the embodiment.
Figure 13C:
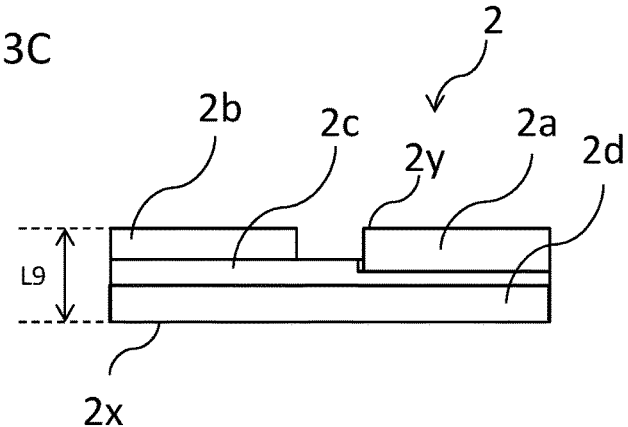
FIG. 13C is a schematic cross-sectional view of the light emitting element according to the embodiment.

As shown in FIG. 13C, each light emitting element 2 used in the linear light emitting device 100 has a semiconductor stack 2c, which includes a first semiconductor layer (e.g., n-type semiconductor layer), an emission layer, and a second semiconductor layer (e.g., p-type semiconductor layer) stacked in that order. The same face, which is the lower face (e.g., the face on the second semiconductor side), has both the first electrode 2a electrically connected to the first semiconductor layer and the second electrode 2b electrically connected to the second semiconductor layer. The semiconductor stack 2c is usually formed on an element substrate 2d, but the light emitting element 2 may be with or without the element substrate 2d.

The types and the materials for the first semiconductor layer, the emission layer, and the second semiconductor layer are not particularly limited. Examples include various semiconductors, such as group III-V compound semiconductors, group II-VI compound semiconductors, and the like. Specific examples include nitride-based semiconductor materials, such as $In_XAl_YGa_{1-X-Y}N$ ($0 \leq X$, $0 \leq Y$, $X+Y \leq 1$); InN, AlN, GaN, InGaN, AlGaN, InGaAlN, or the like can be used. Any thickness for each layer and any stack structure known in the art can be used.

Examples of the element substrate 2d include a substrate for growing semiconductor layers by way of epitaxial growth. Materials for such an element substrate 2d include an insulating substrate, such as sapphire ($Al_2O_3$) or spinel ($MgAl_2O_4$), and the nitride-based semiconductor substrates described above. When a light transmissive element substrate 2d such as a sapphire substrate is used for the substrate for growing semiconductor layers, the substrate can be used in the linear light emitting device without being removed from the semiconductor stack.

The element substrate 2d may have a number of protrusions and indentations on the surface. Moreover, the substrate may form an off-cut angle of about 0 to 10° with a prescribed crystal plane, such as the C-plane or A-plane.

There may be a semiconductor or insulating layer, such as an intermediate layer, buffer layer, or base layer disposed between the element substrate 2d and the first semiconductor layer.

The plan view shape of the semiconductor stack 2c is not particularly limited, and is preferably a square shape or the like. The size of the semiconductor stack 2c in a plan view can be suitably adjusted in accordance with the plan view size of the light emitting element 2.

First Electrode 2a and Second Electrode 2b

The first electrode 2a and the second electrode 2b are disposed on the lower face 2y side of each light emitting element 2. They are preferably disposed on the same face of the semiconductor stack 2c (the opposite face if the element substrate 2d is present). This enables flip chip mounting where the light emitting element is bonded while facing the first electrode 2a and the second electrode 2b to the positive and negative connection terminals of the mounting substrate 60.

The first electrode 2a and the second electrode 2b can be formed, for example, with a metal such as Au, Pt, Pd, Rh, Ni, W, Mo, Cr, Ti, or an alloy of these, as a single layer or multilayer film. Specific examples include multilayer films such as Ti/Rh/Au, W/Pt/Au, Rh/Pt/Au, W/Pt/Au, Ni/Pt/Au, Ti/Rh, or the like being stacked from the semiconductor layer side. The film thickness may be any that are used in the art.

Furthermore, the first electrode 2a and the second electrode 2b preferably include as part of the electrodes a layer of material having a higher reflectance for the light emitted from the emission layer than that of the remaining material on the side that is closer to the first semiconductor layer and the second semiconductor layer, respectively.

Examples of materials having a high reflectance include a layer containing silver, silver alloy, or aluminum. Any silver alloy material known in the art may be used. The thickness of this layer of material is not particularly limited, and can be, for example, about 20 nm to 1 μm that can effectively reflect the light emitted from the light emitting elements 2. The larger the contact area between this layer of material and the first semiconductor layer or the second semiconductor layer, the more preferable it is.

In the case of using silver or a silver alloy, it is preferable to form a cover layer that covers the surface (preferably the upper face and the end faces) thereof in order to prevent migration of silver. Such a cover layer can be one formed with a metal or alloy normally used as a conductive material, and examples include a single layer of or multilayered material composed of aluminum, copper, nickel, or the like. Among all, AlCu is preferable. The thickness of the cover layer, for example, is about several hundred nm to several μm to effectively prevent silver migration.

So long as the first electrode 2a and the second electrode 2b are electrically connected to the first semiconductor layer and the second semiconductor layer, respectively, the entire surfaces of the electrodes do not need to be in contact with the semiconductor layers, or part of the first electrode 2a and/or part of the second electrode 2b does not need to be positioned on the first semiconductor layer and/or the second semiconductor layer. In other words, the first electrode 2a may be positioned on the second semiconductor layer via an insulating film or the like, and the second electrode 2b may be positioned on the first semiconductor layer via an insulating film or the like. In this manner, the shape of the first electrode 2a or the second electrode can be easily altered. This thus facilitates mounting of the linear light emitting device 100.

The insulating film here is not particularly limited, and can be any single layer or multilayered film used in the art. By using an insulating film or the like, the first electrode 2a and the second electrode 2b can be formed in any given size or position regardless of the surface area of the first semiconductor layer and/or the second semiconductor layer.

With respect to the shapes of the first electrode 2a and the second electrode 2b, in this case, at least on the face that is to be connected to the mounting substrate 60, they preferably have substantially the same planar shapes. It is also preferable, as shown in FIG. 13B, for the first electrode 2a and the second electrode 2b to be disposed to oppose one another while interposing the central portion of the semiconductor stack 2c.

There may be a step between the first principal plane of the first electrode 2a and the first principal plane of the second electrode 2b (the faces opposite those that are on the semiconductor layer), but are preferably substantially level. The term "substantially level" here means that the height of the first principal plane of the first electrode 2a from the second principal plane of the semiconductor stack 2c (opposite the first principal plane) is substantially equal to the height of the first principal plane of the second electrode 2b from the second principal plane of the semiconductor stack 2c. Being "substantially equal" here allows for fluctuations of about ±10% of the height of the semiconductor stack 2c.

Figure 14:
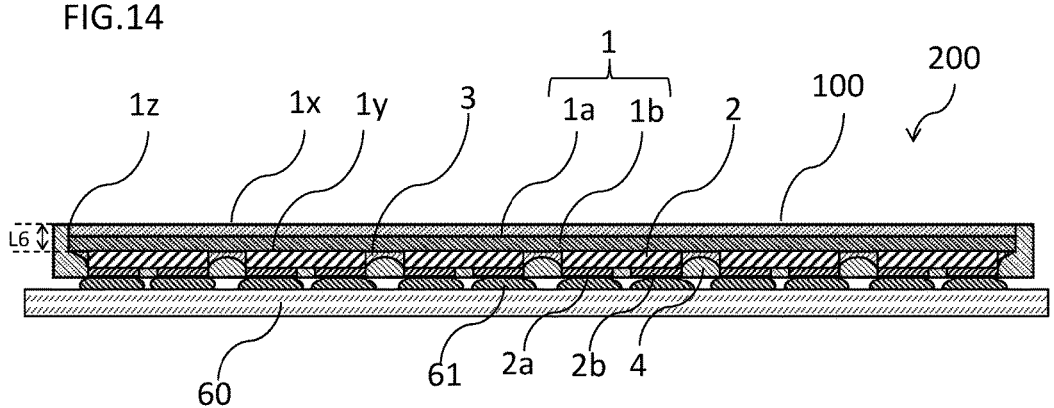
FIG. 14 is a schematic cross-sectional view of a lighting device utilizing the linear light emitting device according to the embodiment.

Making the first principal plane of the first electrode 2a level with the first principal plane of the second electrode 2b as described above, i.e., arranging them on the same plane in effect, facilitates bonding of the linear light emitting device 100 to the mounting substrate 60 or the like as shown in FIG. 14. The first electrode 2a and the second electrode 2b can be formed in this way, for example, by forming a metal film on the electrodes by plating or the like, followed by polishing or grinding to be level.

A DBR (distributed Bragg reflector) layer may be disposed between the first electrode 2a and the first semiconductor layer, and between the second electrode 2b and the second semiconductor layer to the extent that it does not interfere with the electrical connection. A DBR, for example, has a multilayer structure where low refractive index layers and high refractive index layers are stacked on a base layer made of an oxide film or the like to selectively reflect light of a prescribed wavelength. Specifically, by alternately stacking layers of different refractive indices each having a thickness equal to ¼ of the wavelength, light of a prescribed wavelength can be highly efficiently reflected. The layers can be formed with a material that includes at least an oxide or nitride selected from a group consisting of Si, Ti, Zr, Nb, Ta, and Al.

Light Transmissive Adhesive 3

It is preferable to use a light transmissive adhesive 3 for mounting and bonding the light emitting elements 2 to the light transmissive member 1.

For the light transmissive adhesive 3, the use of a light transmissive resin, initially liquid and subsequently curable is preferable. For the light transmissive resin, in particular, a thermosetting resin, such as a silicone resin, silicone modified resin, epoxy resin, phenol resin, or the like can be preferably used. The light transmissive adhesive 3 is disposed in contact with the light extraction face and the lateral faces of the light emitting elements 2 and the light transmissive member 1, and thus can be easily affected by the heat generated at the light emitting elements 2 when turned on. Thermosetting resins are highly heat resistant, and thus is suited for the light transmissive member 3. Preferably, the light transmissive adhesive 3 has a high light transmittance.

The light transmissive adhesive 30 may contain an additive that scatters light. This can homogenize the light emitted between the light emitting elements 2 in the light transmissive adhesive 3. A filler, such as AEROSIL® (fumed silica), may be added to adjust the refractive index of the light transmissive adhesive 3 or the viscosity of the light transmissive material (liquid resin material 31) before curing. This can attenuate the excessive flowing and spreading of the light transmissive adhesive 3, to stably mount the light emitting elements 2 on the light transmissive member 1.

Linear Light Emitting Device 100

The size of the linear light emitting device 100, in terms of the emission face 100w, for example, is substantially the same as the planar shape of the light transmissive member 1 described above, but is larger than that because of the reflective member 4 provided in the surrounding of the light transmissive member 1.

The height L3 of the linear light emitting device 100 is preferably about 300 µm to 700 µm, for example. This can reduce the width of the frame of a backlight when the linear light emitting device 100 is incorporated into the backlight, for example, in the case where the linear light emitting device is mounted so that the incident face of the light guide plate is in parallel to the emission face. For the same reason, as shown in FIG. 14, it is preferable to use the portions of the electrodes 2a and 2b of the light emitting elements that are exposed from the linear light emitting device 100 as the electrodes for mounting the linear light emitting device 100. It is also preferable to provide a thin metal layer across the surfaces of the electrodes 2a and 2b of the light emitting elements 2 and the surface of the reflective member 4. This can promote miniaturization and thickness reduction of the linear light emitting device 100.

EXAMPLES

Example 1

First, a silicone resin, YAG:Ce phosphor particles, and about 2 wt % of AEROSIL® relative to the resin are mixed using a centrifugal vacuum mixer.

Next, after applying the obtained mixture on a fluorine resin release film, the mixture is formed into a sheet of 100 µm in thickness by using a doctor blade (squeegee). The obtained sheet is semicured at 120° C. for one hour. The first layer is thus formed.

Next, 2 wt % of AEROSIL® is added to a silicone resin, and mixed using a centrifugal vacuum mixer. After applying the obtained mixture on a fluorine resin release film, the mixture is formed into a sheet of 50 µm in thickness by using a doctor blade (squeegee) to obtain a transparent sheet which will become the second layer.

The first layer and the second layer are adhered together.

In the manner described above, a base material 11 for the light transmissive members is formed as shown in FIG. 4.

Next, as shown in FIG. 5, the fully cured base material 11 for the light transmissive members is adhered onto the upper face of a support 50 which is constructed with a heat resistant UV sheet 50a having adhesive layers on both sides and shock resistant glass that can transmit UV light.

Next, as shown in FIGS. 6A and 6B, the base material 11 for the light transmissive members is diced using a dicer into a shape of the emission face 100w of a linear light emitting device 100 to obtain a plurality of light transmissive members 1 each having a short-side length L5 of about 300 μm and a long-side length L4 of about 49500 μm in a plan view, and the thickness L6 of about 150 μm. At this point, by adjusting the blade thickness to be substantially equal to the sum of the width of the cutting margin for the reflective member 4 and the thickness of the reflective member 4 to be formed on both sides of the cutting margin, the thickness of the reflective member 4 which will ultimately be obtained (the width in the direction perpendicular to the long side of the light transmissive member 1) can be secured.

Then, as shown in FIGS. 7A and 7B, a liquid resin member 31, which is a silicone resin containing 2 wt % of AEROSIL®, is applied to the upper face of the light transmissive member 1 at multiple spaced apart locations using a dispenser.

Next, as shown in FIGS. 8A and 8B, a plurality of light emitting elements 2 are mounted on the upper face of the light transmissive member. Each light emitting element 2 is structured, as shown in FIGS. 13A to 13C, with an element substrate 2d, which is a light transmissive sapphire substrate to serve as the light extraction face, a semiconductor stack 2c, and electrodes 2a and 2b. The light emitting element 2 has a short-side length L8 of about 200 μm and a long-side length L7 of about 1000 μm in a plan view, and the thickness L9 of about 150 μm. Thirty-three pieces of such light emitting elements 2 are mounted at about 500 μm intervals so that their element substrates 2d oppose the upper face 1y of the light transmissive member. Subsequently, the liquid resin material 31 is cured to bond the light emitting elements 2 and the light transmissive member 1 with the light transmissive adhesive 3. At this time, the light transmissive adhesive 3 is disposed between the lateral faces of adjacent light emitting elements, and formed into a shape that spreads from the lower face 2y of the light emitting elements 2 to the light transmissive member 1.

Next, the material for the reflective member is formulated by mixing into a silicone resin silica having a mean particle diameter of 14 μm and titanium oxide, for inorganic particles, having a mean particle diameter of 0.3 μm in the amounts of 2 wt % and 60 wt %, respectively, relative to the weight of the silicone resin.

Then, as shown in FIGS. 9A and 9B, the reflective member 4 is formed by compression molding to collectively cover the upper face of the support 50, the light transmissive members 1, the light transmissive adhesive, 3 and the light emitting elements 2 mounted thereon, which is then hardened.

Next, as shown in FIGS. 10A and 10B, the reflective member 4 is ground from the surface opposite the light transmissive member 1 to expose the electrodes 2a and 2b of the light emitting elements.

Then, the light emitting devices are cut into individual pieces by dicing the reflective member 4 while referencing the positions of the exposed electrodes 2a and 2b.

Lastly, the adhesion of the adhesive layers of the heat resistant UV sheet 50a is weakened by irradiating UV light from the support 50 side. Subsequently, the linear light emitting devices 100 are separated from the UV sheet.

Using the method described above, a linear light emitting device 100 having a short-side length L2 of about 400 μm and a long-side length L1 of about 5000 μm in a plan view, and about 300 μm in height L3 was obtained.

Example 2

Next, Example 2 will be explained.

First, a sheet containing phosphor particles is formed in a similar manner to that employed in Example 2. For the phosphors, a green light emitting f3-SiAlON phosphor and a red light emitting KSF-based phosphor are used.

Next, 2 wt % of AEROSIL® is added to a silicone resin, and mixed using a centrifugal vacuum mixer. After applying the obtained mixture on a fluorine resin release film, the mixture is formed into a sheet of 150 μm in thickness by using a doctor blade to obtain a transparent sheet.

Then, each sheet is semicured at 120° C. for one hour.

Next, the semicured phosphor-containing sheet and the transparent sheet are adhered together by applying presser of 0.5 MPa at 80° C.

Then, the sheets adhered together are fully cured at 150° C. for eight hours.

In the manner described above, a base material for the light transmissive members having a phosphor-containing layer made of a phosphor-containing sheet and a transparent layer made of a transparent sheet is obtained.

Similar to Example 1, the base material for the light transmissive members is adhered to a support having an adhesive layer. At this time, the transparent layer is adhered to the UV sheet.

Next, the base material for the light transmissive members is diced into an emission face shape. Moreover, the blade height is adjusted so as not to cut 50 μm of the transparent layer. In other words, the light transmissive member is cut to a shape which consists of an uncut continuous base portion on the side where the transparent layer is in contact with the support, and separated protruded portions above the base portion. This can reduce the risk of deforming the light transmissive members due to the pressure applied in the subsequent step of forming a reflective member, and the reflective member entering between the UV sheet and the light transmissive member.

Then, similar to Example 1, light emitting elements are mounted, a reflective member is formed, and the electrodes of the light emitting elements are exposed.

Then, the adhesion of the adhesive layer is weakened by irradiating UV light from the support side, and the base material for the light transmissive members is separated from the support and transferred onto another support which is provided with a UV sheet. At this time, the light transmissive members are transferred so that the surfaces where the electrodes of the light emitting elements are exposed are adhered to the support.

Next, the base material for the light transmissive members is ground to remove the base portion of the light transmissive members, part of the reflective member, and part of the transparent layer partly constituting the protruded portions.

Then, the reflective member is cut by dicing while referencing the positions of the light transmissive members, which are the emission faces.

Next, the adhesive layer is hardened by irradiating with UV light from the glass support side, and the products are separated from the support.

Using the method described above, a plurality of linear light emitting devices each having a transparent layer on the emission face side of the light transmissive member can be easily obtained.

Although several embodiments and examples of the present invention have been illustrated above, the present invention is not limited to these embodiments and examples described above. Various other embodiments are possible so long as they do not deviate from the spirit and the scope of the invention.

What is claimed is:

1. A method for manufacturing a linear light emitting device that includes a plurality of light emitting elements, the method comprising:
    providing a light transmissive member that is mounted on a support via a UV curable pressure sensitive adhesive layer, the light transmissive member having a first side and a second side in a plan view, the first side being longer than the second side;
    mounting the plurality of light emitting elements on the light transmissive member that is mounted on the support, via a light transmissive adhesive, such that the light emitting elements are arranged in a row along the first side of the light transmissive member; and
    forming a reflective member that covers the light transmissive adhesive and lateral faces of the light emitting elements;
    wherein the linear light emitting device has an emission face having a first side and a second side in a plan view, the first side being longer than the second side, and
    wherein a length of the second side of the light transmissive member is substantially equal to a length of the second side of the emission face of the linear light emitting device.

2. The method for manufacturing a linear light emitting device according to claim 1, wherein, in the step of mounting the light emitting elements, the light transmissive adhesive and/or the light emitting elements are positioned by using edges of the light transmissive member.

3. The method for manufacturing a linear light emitting device according to claim 1, wherein the step of providing the light transmissive member comprises:
    mounting a base material for the light transmissive member on the support; and
    cutting the base material to obtain the light transmissive member.

4. The method for manufacturing a linear light emitting device according to claim 3, wherein the step of mounting the light emitting elements on the light transmissive member and the step of forming the reflective member are performed on the support on which the light transmissive member is mounted.

5. The method for manufacturing a linear light emitting device according to claim 1, wherein the light transmissive adhesive is disposed so as to be continuous between the plurality of light emitting elements.

6. The method for manufacturing a linear light emitting device according to claim 3, wherein the base material for the light transmissive member is a resin.

7. The method for manufacturing a linear light emitting device according to claim 1, wherein a length of the first side of the light transmissive member is 50 to 500 times the length of the second side of the light transmissive member.

8. The method for manufacturing a linear light emitting device according to claim 1, wherein:
    each of the light emitting elements has a first side and a second side in a plan view, the first side being longer than the second side; and
    the length of the second side of the light transmissive member is one to two times a length of the second sides of the light emitting elements.

9. The method for manufacturing a linear light emitting device according to claim 1, wherein the reflective member covers lateral faces of the light transmissive member.

10. The method for manufacturing a linear light emitting device according to claim 1, wherein:
    the step of providing the light transmissive member comprises providing a plurality of light transmissive members;
    the step of mounting a plurality of light emitting elements on the light transmissive member comprises mounting a plurality of light emitting elements on each of the light transmissive members; and
    the step of forming the reflective member comprises forming the reflective member so as to cover a group of the light transmissive members; and
    the method further comprises cutting the reflective member to obtain a plurality of linear light emitting devices.

11. The method for manufacturing a linear light emitting device according to claim 1, wherein an edge of the light transmissive adhesive is aligned with a first-side edge of the light transmissive member when viewed in a direction along the first side of the light transmissive member.

12. The method for manufacturing a linear light emitting device according to claim 1, further comprising, after the step of forming the reflective member, removing the support.

13. A linear light emitting device comprising:
    a plurality of light emitting elements, each having a first side and a second side in a plan view, the first side being longer than the second side, wherein each of the light emitting elements comprises a pair of electrodes;
    a light transmissive member having a first side and a second side in a plan view, the first side being longer than the second side;
    a light transmissive adhesive that adheres the light emitting elements to the light transmissive member; and
    a reflective member that covers the light transmissive adhesive and lateral faces of the light emitting elements;
    wherein the light emitting elements are arranged in a row such that the first sides of the light emitting elements coincide with the first side of the light transmissive member;
    wherein the light transmissive adhesive is disposed between the lateral faces of adjacent light emitting elements; and
    wherein a metal film is formed on each of the electrodes of the light emitting elements, the metal film being exposed from the reflective member.

14. The linear light emitting device according to claim 13, wherein first-side edges of the light transmissive member coincide with edges of the light transmissive adhesive.

15. The linear light emitting device according to claim 13, wherein the light transmissive adhesive is shaped to spread from lower face sides of the light emitting elements to the light transmissive member.

16. The linear light emitting device according to claim 13, wherein the light transmissive adhesive is shaped to spread from lower face sides of the light emitting elements to the light transmissive member at second-side edges of the light transmissive member.

17. The linear light emitting device according to claim 13, wherein the light transmissive member comprises a resin base material.

18. The linear light emitting device according to claim 13, wherein a length of the first side of the light transmissive member is 50 to 500 times a length of the second side of the light transmissive member.

19. The linear light emitting device according to claim 13, wherein a length of the second side of the light transmissive member is one to two times a length of the second sides of the light emitting elements.

20. The linear light emitting device according to claim 13, wherein lateral faces of the light transmissive member are covered by the reflective member.

* * * * *